(12) United States Patent
Hatakeyama et al.

(10) Patent No.: US 9,466,546 B2
(45) Date of Patent: Oct. 11, 2016

(54) SEMICONDUCTOR DEVICE AND METHOD OF FORMING THE SAME

(75) Inventors: Koichi Hatakeyama, Tokyo (JP); Mitsuhisa Watanabe, Tokyo (JP); Keiyo Kusanagi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 780 days.

(21) Appl. No.: 13/293,769

(22) Filed: Nov. 10, 2011

(65) Prior Publication Data

US 2012/0126402 A1 May 24, 2012

(30) Foreign Application Priority Data

Nov. 18, 2010 (JP) ................................ 2010-257875

(51) Int. Cl.
*H01L 23/31* (2006.01)
*H01L 21/56* (2006.01)
(Continued)

(52) U.S. Cl.
CPC ......... *H01L 23/3135* (2013.01); *H01L 21/561* (2013.01); *H01L 21/6836* (2013.01); *H01L 23/3128* (2013.01); *H01L 24/97* (2013.01); *H01L 25/0657* (2013.01); *H01L 23/481* (2013.01); *H01L 2221/68327* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/97* (2013.01); *H01L 2225/06513* (2013.01); *H01L 2225/06541* (2013.01); *H01L 2225/06586* (2013.01); *H01L 2924/014* (2013.01); *H01L 2924/01006* (2013.01); *H01L 2924/01033* (2013.01);
(Continued)

(58) Field of Classification Search
CPC ................ H01L 2224/97; H01L 2224/73204; H01L 2224/32225; H01L 2924/15311; H01L 24/97; H01L 23/3128; H01L 25/0657; H01L 21/561; H01L 23/3135; H01L 2224/16225; H01L 2224/32145; H01L 2224/16145; H01L 2924/181
USPC ................................................ 257/737, 686
See application file for complete search history.

(56) References Cited

U.S. PATENT DOCUMENTS 7,413,925 B2 8/2008 Egawa
8,377,745 B2 * 2/2013 Shimada et al. .............. 438/106
(Continued)

FOREIGN PATENT DOCUMENTS

JP 9-246464 A 9/1997
JP 2001-308230 A 11/2001
(Continued)

OTHER PUBLICATIONS

"3D Chip Stacking and Reliability Using TSVs-Micro C4 Solder Interconnection", IEEE 2010.*
(Continued)

*Primary Examiner* — Bilkis Jahan
*Assistant Examiner* — Nga Doan

(57) ABSTRACT

A semiconductor device includes a wiring board; a stack of semiconductor chips disposed over the wiring board, each of the semiconductor chip comprising via electrodes, the semiconductor chips being electrically coupled through the via electrodes to each other, the semiconductor chips being electrically coupled through the via electrodes to the wiring board; a first seal that seals the stack of semiconductor chips; and a second seal that covers the first seal. The first seal is smaller in elastic modulus than the second seal.

26 Claims, 11 Drawing Sheets

(51) Int. Cl.
  *H01L 21/683*     (2006.01)
  *H01L 23/00*      (2006.01)
  *H01L 25/065*     (2006.01)
  *H01L 23/48*      (2006.01)

(52) U.S. Cl.
  CPC ............... *H01L2924/01079* (2013.01); *H01L 2924/15311* (2013.01); *H01L 2924/181* (2013.01)

(56) References Cited

U.S. PATENT DOCUMENTS

2010/0258931 A1* 10/2010 Yoshida .................. H01L 24/97 257/686
2010/0258933 A1* 10/2010 Fujishima ............. H01L 21/566 257/686
2011/0074037 A1* 3/2011 Takeshima et al. .......... 257/773

FOREIGN PATENT DOCUMENTS

| JP | 2006-202936 A | 8/2006 |
| JP | 2006-278817 A | 10/2006 |
| JP | 2006-319243 A | 11/2006 |
| JP | 2007-067047 A | 3/2007 |
| JP | 2007-214220 A | 8/2007 |
| JP | 2008-294367 A | 12/2008 |
| JP | 2009-239256 A | 10/2009 |
| JP | 2010-144144 A | 7/2010 |
| JP | 2010-245383 A | 10/2010 |
| JP | 2010-251408 A | 11/2010 |

OTHER PUBLICATIONS

"3D SiP Module Using TSVs and Novel Solder Bump Maker", IEEE 2010.*

* cited by examiner

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2010-257875, filed Nov. 18, 2010, the content of which is incorporated herein by reference.

2. Description of the Related Art

In recent years, with advances in multifunctionality and high speed in semiconductor chips, in order to achieve the accompanying high-density packaging, development is progressing in so-called CoC (chip-on-chip) technology, whereby chip stacking is done by forming through electrodes within the chip and performing flip-chip stacking using bumps.

A conventional semiconductor device to which such CoC technology is applied is disclosed in Japanese Patent Application Publication No. JPA 2007-214220 as a semiconductor device having, on an interposer substrate, a chip stack constituted by the stacking of a plurality of semiconductor chips, an underfilling material that fills between the chips of the chip stack, and a molding resin that covers the chip stack and the underfilling material.

SUMMARY

In one embodiment, a semiconductor device may include, but is not limited to, a wiring board; a stack of semiconductor chips disposed over the wiring board, each of the semiconductor chip comprising via electrodes, the semiconductor chips being electrically coupled through the via electrodes to each other, the semiconductor chips being electrically coupled through the via electrodes to the wiring board; a first seal that seals the stack of semiconductor chips; and a second seal that covers the first seal. The first seal is smaller in elastic modulus than the second seal.

In another embodiment, a semiconductor device may include, but is not limited to, a wiring board; a stack of semiconductor chips disposed over the wiring board, each of the semiconductor chip comprising via electrodes and bump electrodes, the semiconductor chips being electrically coupled through the via electrodes and the bump electrodes to each other, the semiconductor chips being electrically coupled through the via electrodes and the bump electrodes to the wiring board; a first seal that seals the stack of semiconductor chips, the first seal filling gaps between the semiconductor chips and a gap between the wiring board and the stack of semiconductor chips; and a second seal that covers the first seal. The first seal is smaller in Young's modulus than the second seal.

In still another embodiment, a semiconductor device may include, but is not limited to, an interposer substrate; a stack of semiconductor chips disposed over the wiring board, each of the semiconductor chip comprising via electrodes, the semiconductor chips being electrically coupled through the via electrodes to each other, the semiconductor chips being electrically coupled through the via electrodes to the wiring board; an underfilling resin that seals the stack of semiconductor chips, the underfilling resin filling gaps between the semiconductor chips and a gap between the wiring board and the stack of semiconductor chips; and a mold resin that covers the underfilling resin. The underfilling resin is smaller in Young's modulus than the mold resin.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
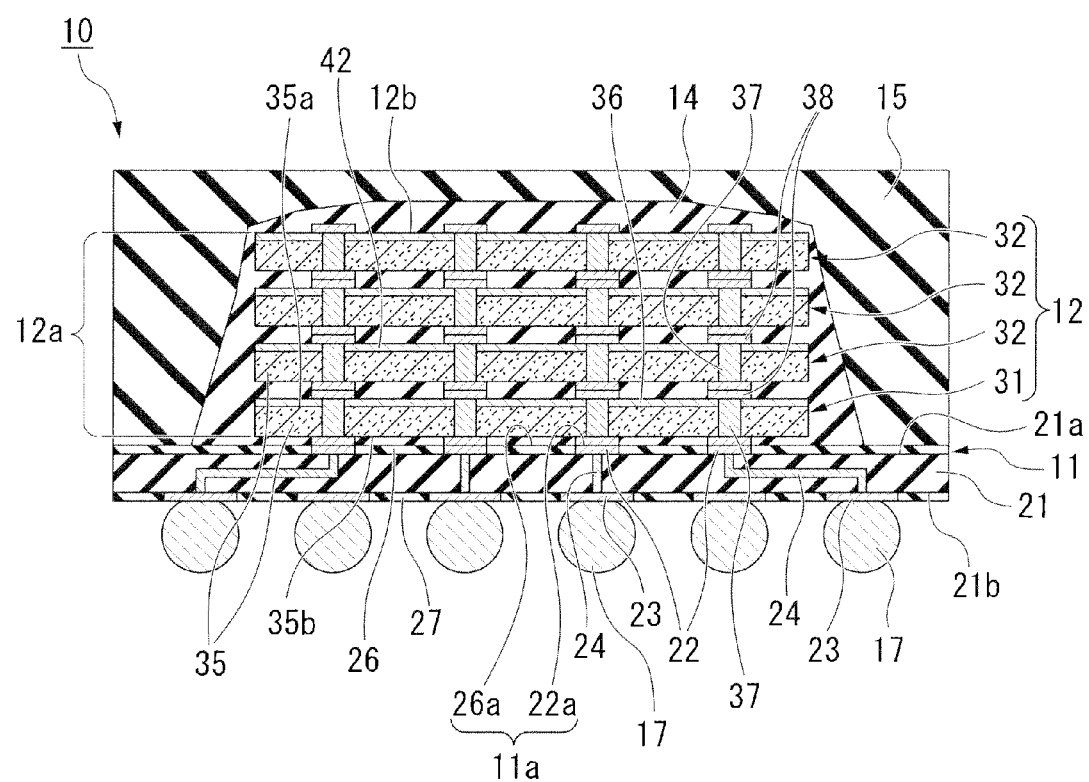
FIG. 1 is a cross sectional elevation view of a semiconductor device in accordance with a first preferred embodiment of the present invention.

Before describing the present invention, the related art will be explained, in order to facilitate the understanding of the present invention.

In the above-mentioned plurality of semiconductor chips, however, in order to form the through electrodes, because the structure is thin and flat, the semiconductor chips deform because of the stress (semiconductor internal stress) due to the curing shrinkage of the molding resin and underfilling material.

Because of this, there was a risk of damage (breakage) of the semiconductor chips themselves, the bonding parts that make electrical connection between the semiconductor chips, and the connecting parts between the semiconductor chips and the interposer substrate.

If such damage occurs, the electrical connection reliability of the semiconductor device is reduced.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a wiring board; a stack of semiconductor chips disposed over the wiring board, each of the semiconductor chip comprising via electrodes, the semiconductor chips being electrically coupled through the via electrodes to each other, the semiconductor chips being electrically coupled through the via electrodes to the wiring board; a first seal that seals the stack of semiconductor chips; and a second seal that covers the first seal. The first seal is smaller in elastic modulus than the second seal.

In some cases, the first seal fills gaps between the semiconductor chips and a gap between the wiring board and the stack of semiconductor chips.

In some cases, the first seal covers outer sides of the stack of semiconductor chips.

In some cases, the first seal covers a first surface of the stack of semiconductor chips, the first surface being opposite to a second surface of the stack of semiconductor chips, the second surface facing toward the wring board.

In some cases, the first seal comprises a silicone rubber.

In some cases, the second seal comprises a mold resin.

In some cases, each of the semiconductor chip further comprises bump electrodes, the semiconductor chips being electrically coupled through the via electrodes and the bump electrodes to each other, the semiconductor chips being electrically coupled through the via electrodes and the bump electrodes to the wiring board.

In some cases, the semiconductor device may further include, but is not limited to, external connection electrodes disposed on a first surface of the wiring board, the wiring board having a second surface opposite to the first surface. The stack of semiconductor chips is disposed over the second surface of the wiring board.

In some cases, each of the semiconductor chips comprises a circuit element layer on a surface which faces away from the wiring board.

In another embodiment, a semiconductor device may include, but is not limited to, a wiring board; a stack of semiconductor chips disposed over the wiring board, each of the semiconductor chip comprising via electrodes and bump electrodes, the semiconductor chips being electrically coupled through the via electrodes and the bump electrodes to each other, the semiconductor chips being electrically coupled through the via electrodes and the bump electrodes to the wiring board; a first seal that seals the stack of semiconductor chips, the first seal filling gaps between the semiconductor chips and a gap between the wiring board and the stack of semiconductor chips; and a second seal that covers the first seal. The first seal is smaller in Young's modulus than the second seal.

In some cases, the first seal covers outer sides of the stack of semiconductor chips.

In some cases, the first seal covers a first surface of the stack of semiconductor chips, the first surface being opposite to a second surface of the stack of semiconductor chips, the second surface facing toward the wring board.

In some cases, the first seal comprises a silicone rubber.

In some cases, the second seal comprises a mold resin.

In some cases, the semiconductor device may further include, but is not limited to, external connection electrodes disposed on a first surface of the wiring board, the wiring board having a second surface opposite to the first surface. The stack of semiconductor chips is disposed over the second surface of the wiring board.

In still another embodiment, a semiconductor device may include, but is not limited to, an interposer substrate; a stack of semiconductor chips disposed over the wiring board, each of the semiconductor chip comprising via electrodes, the semiconductor chips being electrically coupled through the via electrodes to each other, the semiconductor chips being electrically coupled through the via electrodes to the wiring board; an underfilling resin that seals the stack of semiconductor chips, the underfilling resin filling gaps between the semiconductor chips and a gap between the wiring board and the stack of semiconductor chips; and a mold resin that covers the underfilling resin. The underfilling resin is smaller in Young's modulus than the mold resin.

In some cases, the underfilling resin covers outer sides of the stack of semiconductor chips.

In some cases, the underfilling resin covers a first surface of the stack of semiconductor chips, the first surface being opposite to a second surface of the stack of semiconductor chips, the second surface facing toward the wring board.

In some cases, each of the semiconductor chip further comprises bump electrodes, the semiconductor chips being electrically coupled through the via electrodes and the bump electrodes to each other, the semiconductor chips being electrically coupled through the via electrodes and the bump electrodes to the wiring board.

In some cases, the semiconductor device may further include, but is not limited to, external connection electrodes disposed on a first surface of the interposer substrate, the interposer substrate having a second surface opposite to the first surface. The stack of semiconductor chips is disposed over the second surface of the interposer substrate.

Embodiment:

FIG. 1 is a simplified cross-sectional view showing a semiconductor device according to an embodiment of the present invention.

Referring to FIG. 1, the semiconductor device 10 of the present embodiment is a BGA (ball grid array) type semiconductor device, and has a substantially square interconnect substrate 11, a chip stack 12, a first seal 14, a second seal 15, and external connection terminals 17.

An interconnect substrate 11 has a substrate body 21, connection patterns 22, lands 23, interconnect patterns 24, and solder resist 26 and 27.

The substrate body 21 is formed to be substantially square, and to have flat upper and lower surfaces 21a and 21b, respectively.

It is possible to use a flexible substrate, for example, made of a polyimide resin, as the substrate body 21, in which case the thickness of the substrate body 21 can be made, for example, 100 μm.

Connection pads 22 are provided on the upper surface 21a of the substrate body 21. The chip stack 12 is mounted to the connection pads 22. By doing this, the connection pads 22 are electrically connected to the chip stack 12.

The lands 23 are provided on the lower surface 21b of the substrate body 21. The lands 23 have the external connection terminals 17 mounted thereto.

The interconnect patterns 24 are provided on the inside of the substrate body 21. One end of an interconnect pattern 24 is connected to a connection pad 22, and the other end of the interconnect pattern 24 is connected to a land 23.

The solder resist 26 is provided on the upper surface 21a of the substrate body 21 so that the upper surfaces 22a (the surface on which the chip stack 12 is mounted) of the connection pads 22 is exposed.

In the case of the interconnect substrate 11 provided in the semiconductor device 10 of the present embodiment, the main surface 11a of the interconnect substrate 11 refers to the surface constituted by the upper surfaces 22a of the interconnect pads 22 and the upper surface 26a of the solder resist 26.

The solder resist 27 is provided on the lower surface 21b of the substrate body 21 so that the lower surfaces of the lands 23 (surfaces on which the external connection terminals 17 are mounted) are exposed.

The chip stack 12 is constituted by one semiconductor chip 31 and three semiconductor chips 32, which are stacked on the main surface 11a of interconnect substrate 11 (specifically, the upper surfaces 22a of the connection pads 22).

The semiconductor chip 31 is a semiconductor chip for interfacing, and has a semiconductor substrate 35, a circuit element layer 36, through electrodes 37, and bumps 38 and 39.

The circuit element layer 36 is formed on the surface 35a of the semiconductor substrate 35. An interface circuit that controls a plurality of semiconductor chips 380stacked on the semiconductor chip 31 is formed on the circuit element layer 36.

The through electrodes 37 are provided so as to pass through the semiconductor substrate 35 and the circuit element layer 36. The through electrodes 37 are electrically connected to the circuit element layer 36.

The bumps 38 are provided on the upper ends of the through electrodes 37. The bumps 39 are provided at the lower ends of the through electrodes 37, and make connection to the connection pads 22 provided on the interconnect substrate 11. By doing this, the semiconductor chip 31 is electrically connected to the interconnect substrate 11.

The semiconductor chip 32, with the exception of having a circuit element layer 42 in place of the circuit element layer 36 provided in the semiconductor chip 31, is constituted the same as the semiconductor chip 31. A DRAM (dynamic random access memory) is formed on the circuit element layer 42.

The bumps 39 of the semiconductor chip 32 of the three semiconductor chips 32 that is disposed on the lowermost layer are connected to the bumps 38 of the semiconductor chip 31. By doing this, the semiconductor chip 32 disposed on the lowermost layer is electrically connected to the semiconductor chip 31.

The bumps 39 of the semiconductor chip 32 of the three semiconductor chips 32 that is disposed in the very middle are connected to the bumps 38 of the semiconductor chip 31 disposed in the lowermost layer. By doing this, the semiconductor chip 32 disposed in the very middle is electrically connected to the semiconductor chip 32 in the lowermost layer.

The bumps 39 of the semiconductor chip 32 of the three semiconductor chips 32 that is disposed in the uppermost layer are connected to the bumps 38 of the semiconductor chip 31 disposed in the very middle. By doing this, the semiconductor chip 32 disposed in the uppermost layer is electrically connected to the semiconductor chip 32 disposed in the very middle.

That is, the plurality of semiconductor chips 31 and 32 having the constitutions noted above are electrically connected via the bumps 38 and 39 and the through electrodes 37.

The first seal 14 is provided between (in the gaps between) the plurality of semiconductor chips 31 and 32, between (in the gap between) the chip stack 12 and the main surface 11a of the interconnect substrate 11, on the outer peripheral surface 12a of the chip stack 12 and the upper surface 12b of the chip stack 12 (the surface of the chip stack 12 positioned on the opposite side from the surface that opposes the main surface 11a of the interconnect substrate 11), thereby sealing the plurality of semiconductor chips31 and 32 (chip stack 12).

The first seal 14 has an elastic modulus (Young's modulus) that is smaller than that of the second seal 15 that covers the first seal 14.

In this manner, by providing the first seal 14 that seals between the plurality of semiconductor chips 31 and 32 and between the chip stack 12 and the main surface of the interconnect substrate 11, and making the elastic modulus (Young's modulus) of the first seal 14 smaller than that of the second seal 15 that covers the first seal 14, it is possible to hinder the transmission of internal stress generated within the semiconductor device 10 to the plurality of semiconductor chips 31 and 32.

By doing this, in addition to enabling the suppressing of damage to the plurality of semiconductor chips 31 and 32, it is possible to hinder the transmission of internal stress to the connection parts between the semiconductor chips 31 and 32 (specifically, the parts at which the bumps 38 and 39 connect), the connection parts between the semiconductor chips 32 (specifically, the parts at which the bumps 38 and 39 connect), and the connection parts between the semiconductor chip 31 and the interconnect substrate 11 (specifically, the parts at which the bumps 39 and the connection pads 22 connect).

It is therefore possible to improve the electrical connection reliability between the plurality of semiconductor chips 31 and 32, and between the chip stack 12 and the interconnect substrate 11.

An underfilling resin, specifically, for example, a silicone rubber, can be used as the material of the first seal 14.

In this manner, by using silicone rubber as the material for the first seal 14, it is possible to hinder the transmission of stress to the connection parts between the semiconductor chips 31 and 32, the connection parts between the semiconductor chips 32, and the connection part between the semiconductor chip 31 and the interconnect substrate 11.

The second seal 15 is provided on the main surface 11a of the interconnect substrate 11 so as to cover the first seal 14. A molding resin having an elastic modulus (Young's modulus) that is larger than that of the first seal 14 is used as the material of the second seal 15.

The external connection terminals 17 are provided on the lands 23 of the interconnect substrate 11. By doing this, the external connection terminals 17 are electrically connected to the chip stack 12 via the interconnect substrate 11.

The external connection terminals 17 are terminals that connect to a mounting board (not shown) such as a mother board.

Solder balls, for example, can be used as the external connection terminals 17.

According to the semiconductor device of the present embodiment, by providing the first seal 14 that seals between the plurality of semiconductor chips 31 and 32 and between the chip stack 12 and the main surface 11a of the interconnect substrate 11, and the second seal 15 provided on the main surface 11a of the interconnect substrate 11 that covers the first seal 14, and also making the elastic modulus (Young's modulus) of the first seal 14 smaller than that of the second seal 15, it is possible to hinder the transmission of internal stress generated within the semiconductor device 10 to the plurality of semiconductor chips 31 and 32.

By doing this, not only is it possible suppress damage to the plurality of semiconductor chips 31 and 32, but it is also possible to hinder the transmission of internal stress to the connection parts between the plurality of semiconductor chips 31 and 32, the connection parts between the semiconductor chips 32, and the connection part between the semiconductor chip 31 and the interconnect substrate 11.

It is therefore possible to improve the electrical connection reliability between the plurality of semiconductor chips 31 and 32, and between the chip stack 12 and the interconnect substrate 11.

The first seal 14 can be provided at least between the plurality of semiconductor chips 31 and 32 and between the chip stack 12 and the main surface 11a of the interconnect substrate 11, in which case it is possible to improve the electrical connection reliability of the connection parts between the semiconductor chips 31 and 32, the connection parts between the semiconductor chips 32, and the connection parts between the semiconductor chip 31 and the interconnect substrate 11.

Although the above description is for the semiconductor device 10 shown in FIG. 1, which case there are four semiconductor chips 31 and 32 stacked on the main surface 11a of the interconnect substrate 11, the number of semiconductor chips 31 and 32 stacked on the main surface 11a of the interconnect substrate 11 may be two or more, and is not restricted to the configuration of the semiconductor device 10 shown in FIG. 1.

Figure 2:
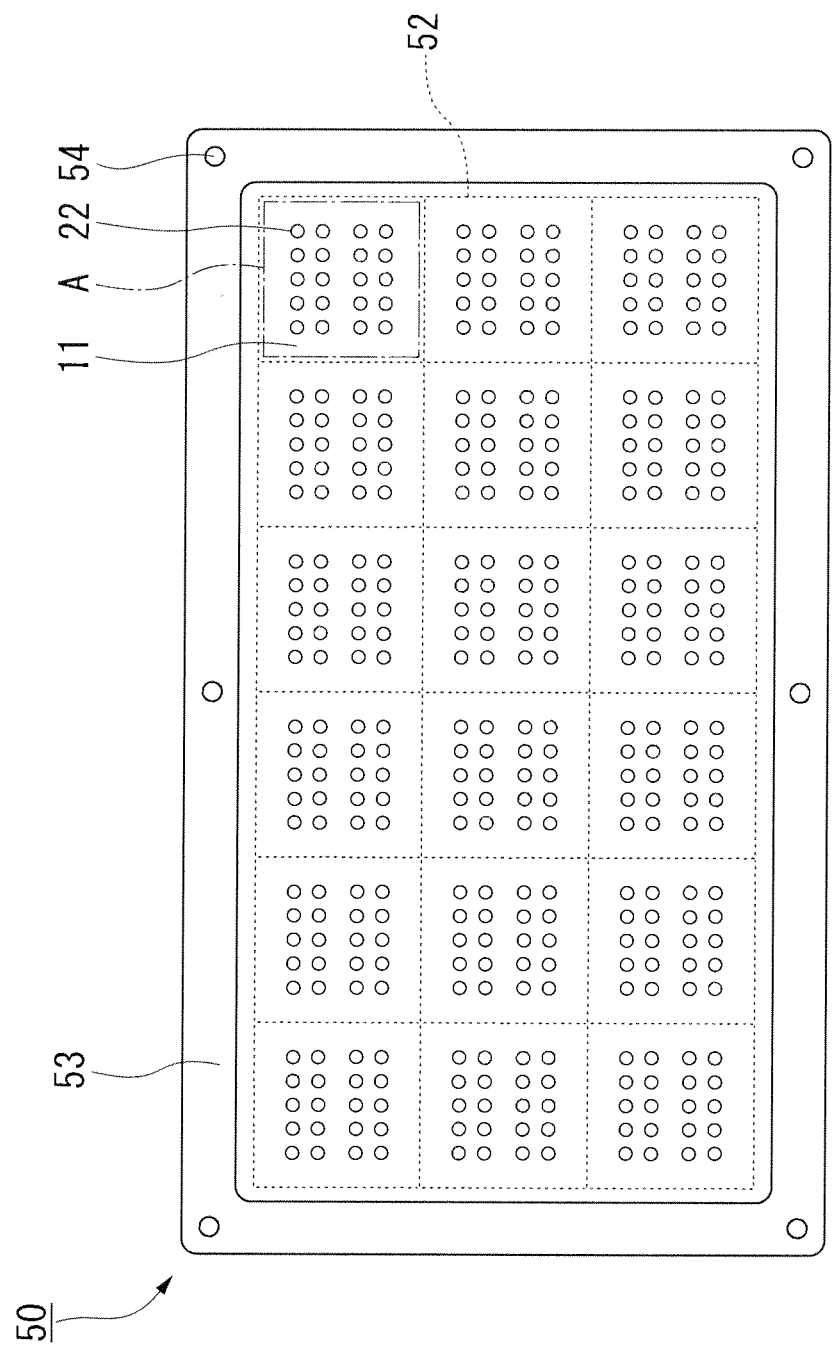
FIG. 2 is a plan view of a mother board to used for foiming the semiconductor device of FIG. 1 in accordance with the first preferred embodiment of the present invention.

FIG. 2 is a plan view showing the interconnect mother board used when manufacturing the semiconductor device according to the present embodiment of the present invention. In FIG. 2, constituent elements that are the same as in the interconnect substrate 11 shown in FIG. 1 are assigned the same reference numerals.

The interconnect mother board 50 used in manufacturing the semiconductor device 10 of the present embodiment is described below.

Referring to FIG. 2, the interconnect mother board 50 has a plurality of semiconductor device formation regions A in which the semiconductor devices 10 are formed, disposed in a matrix arrangement, dicing lines 52 surrounding each of the semiconductor device formation regions A, a frame 53 disposed on the outside of the plurality of semiconductor device formation regions A, and positioning holes 54, disposed in the frame 53 with a prescribed spacing and used in transporting and positioning the interconnect mother board 50.

In a semiconductor device formation regions A an interconnect substrate 11 is formed as one with the interconnect substrates 11 formed in adjacent semiconductor device formation regions A. That is, the interconnect mother board 50 is constituted by a plurality of linked interconnect substrates.

The interconnect mother board 50 constituted as noted above is a board that is processed by MAP (mold array processing). By cutting the interconnect mother board 50 apart along the dicing lines 52, a plurality of separated interconnect substrates 11 are obtained. Marks (not shown) for dicing are formed in the frame 23.

FIG. 3 to FIG. 9 are cross-sectional views showing the manufacturing process steps for a semiconductor device according to the present embodiment of the present invention.

In FIG. 3 to FIG. 9, constituent parts that are the same as in the semiconductor device 10 shown in the embodiment shown in FIG. 1 and the interconnect mother board 50 shown in FIG. 2 are assigned the same reference numerals.

Referring to FIG. 3 to FIG. 9, the method for manufacturing the semiconductor device 10 of the present embodiment will be described.

Figure 3:
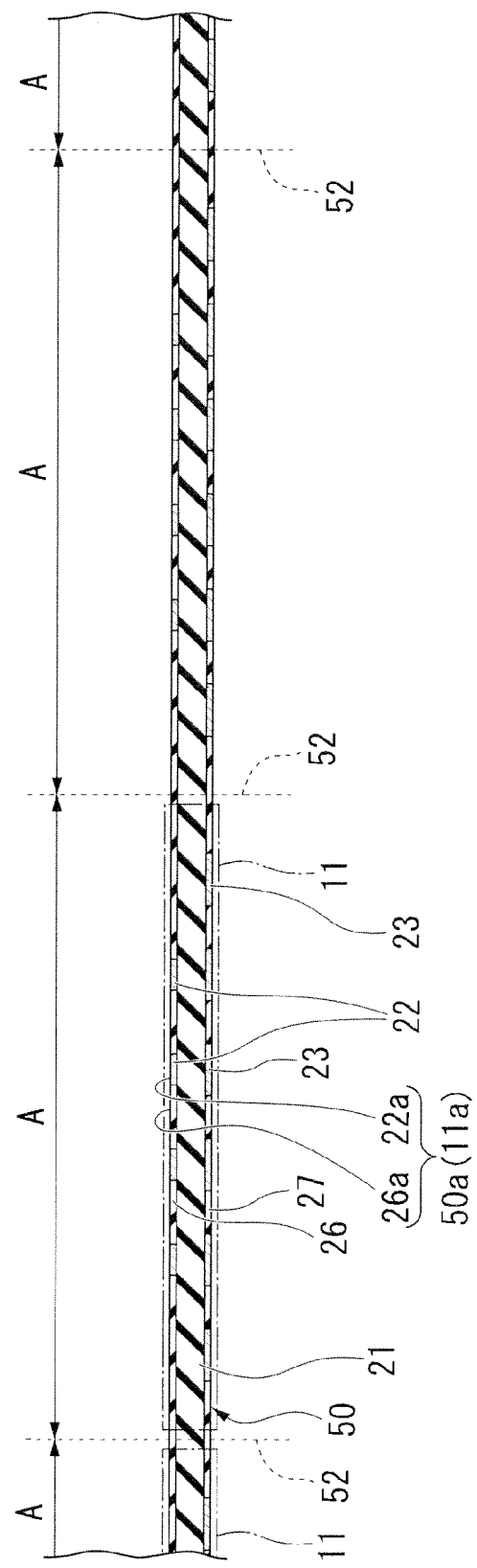
FIG. 3 is a cross sectional elevation view of a step involved in a method of forming the semiconductor device of FIG. 1 in accordance with the first preferred embodiment of the present invention.

First, in the process step shown in FIG. 3, an interconnect mother board 50 shown in FIG. 2 and described above is prepared. Next, bumps that are not illustrated are formed on the upper surfaces 22a of the connection pads 22. These bumps (not shown) are formed, for example, by using a bonding apparatus, by thermosonic bonding of gold wires to the upper surfaces 22a of the connection pads 22, followed by pulling out the rear ends of the gold wires (wire stud bump process).

Figure 4:
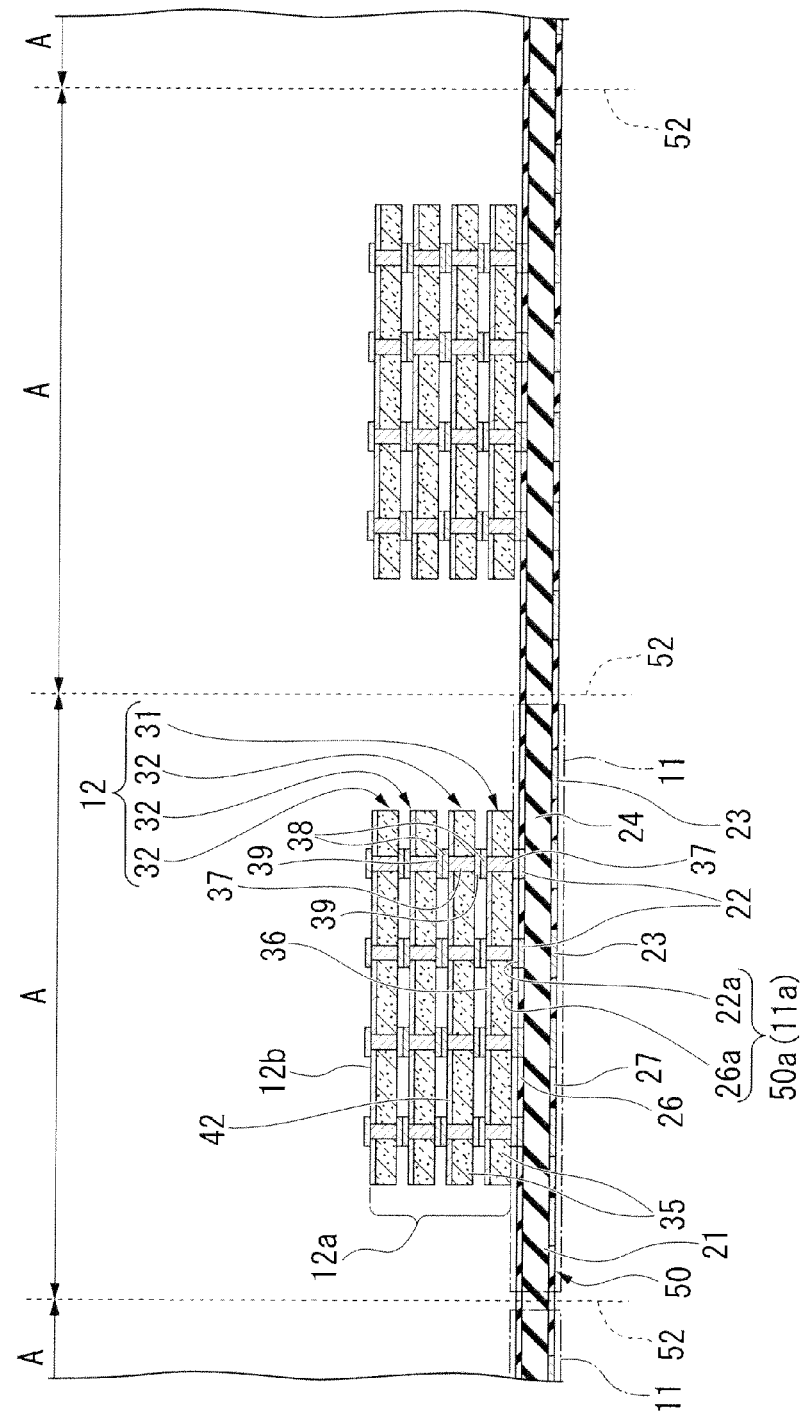
FIG. 4 is a cross sectional elevation view of a step, subsequent to the step of FIG. 3, involved in the method of forming the semiconductor device of FIG. 1 in accordance with the first preferred embodiment of the present invention.

In the process step shown in FIG. 4, the bumps that are not illustrated formed on the upper surfaces 22a of the connection pads 22 and the bumps 39 provided on the semiconductor chip 31 are brought into contact, after which a low temperature (for example 150° C.) is used to fuse the bumps (not shown) and the bumps 39, thereby temporarily attaching the semiconductor chip 31 to the connection pads 22 of the interconnect mother board 50.

A semiconductor chip 32 is placed over the semiconductor chip 31, so that the bumps 38 provided on the semiconductor chip 31 and the bumps 39 provided on the semiconductor chip 32 make contact with one another. After that, bumps 38 and 39 are fused at a low temperature (for example, 150° C.) to temporarily attach the semiconductor chip 32 onto the semiconductor chip 31.

Using the same method as that of placing the semiconductor chip 32 over the semiconductor chip 31, two semiconductor chips 32 are sequentially temporarily attached to the top of the semiconductor chip 32.

After the above, the stacked plurality of semiconductor chips 31 and 32 are heated to a high temperature (for example, 300° C.) and have a load applied thereto so as to completely pressure bond the bumps 39 of the semiconductor chip 31 with the bumps (not shown) of the interconnect mother board 50, the bumps 39 of the semiconductor chip 32 with the bumps 38 of the semiconductor chip 31, and the bumps 38 of one semiconductor chip 32 with the bumps 39 of another semiconductor chip 32.

By doing this, an electrical connection is made between the plurality of semiconductor chips 31 and 32, and also a chip stack 12 is formed which is electrically connected to the interconnect mother board 50 (interconnect substrate 11).

When this is done, gaps are formed between the semiconductor chip 31 and the semiconductor chip 32, between semiconductor chips 32, and between the semiconductor chip 31 and the interconnect mother board 50 (interconnect substrate 11).

Although in the foregoing description is of the case in which, after temporary attachment, a plurality of semiconductor chips 31 and 32 and the interconnect mother board 50 are electrically connected by the application of a load, the plurality of semiconductor chips 31 and 32 and the connection pads 22 may be electrically connected by, for example, ultrasonic waves. Also, high-temperature pressure bonding may be done each time one of the plurality of semiconductor chips 31 and 32 is laminated, without doing temporary attachment.

Figure 5:
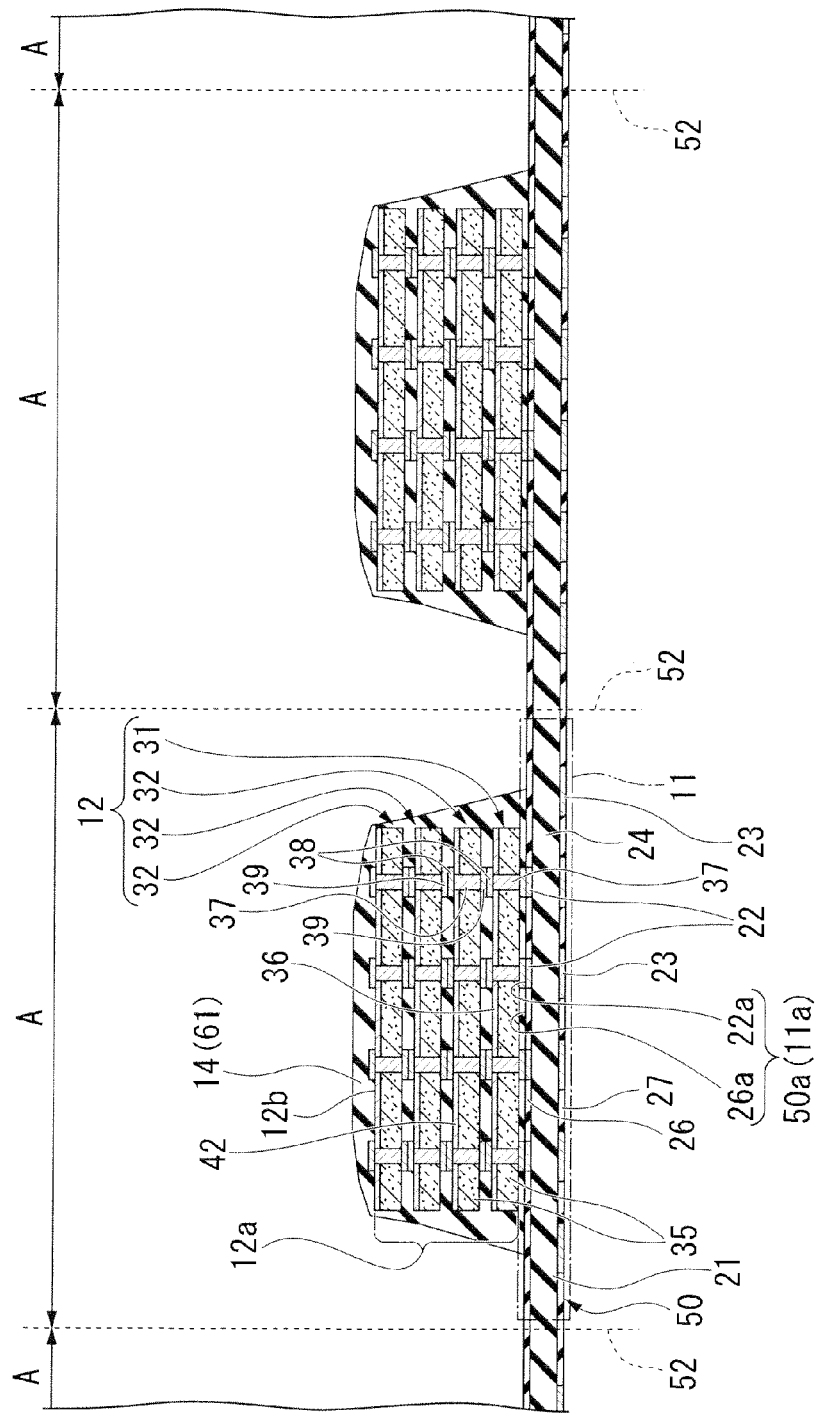
FIG. 5 is a cross sectional elevation view of a step, subsequent to the step of FIG. 4, involved in the method of forming the semiconductor device of FIG. 1 in accordance with the first preferred embodiment of the present invention.

In the process step shown in FIG. 5, a first seal 14 is formed so as to fill between (in the gap between) the semiconductor chip 31 and the semiconductor chip 32, between (in the gap between) the semiconductor chips 32, and between (in the gap between) the semiconductor chip 31 and the interconnect substrate 11, and so as to cover the outer peripheral surface 12a and upper surface 12b of the chip stack 12, sealing the chip stack 12 (the plurality of stacked semiconductor chips 31 and 32).

Specifically, by supplying by dripping an underfilling resin 61 (base material of the first seal 14) having an elastic modulus (Young's modulus) smaller than that of the second seal 15 onto the upper surface 12b of the chip stack 12, capillary action causes filling between (in the gap between) the semiconductor chip 31 and the semiconductor chip 32, between (in the gap between) the semiconductor chips 32, and between (in the gap between) the semiconductor chip 31 and the interconnect substrate 11.

When this is done, the upper surface 12b of the chip stack 12 is covered by the drip supply of the underfilling resin 61. Also, the outer peripheral surface 12a of the chip stack 12 is covered by downward movement of the underfilling resin 61 due to the force of gravity.

By doing this, there is filling between the semiconductor chip 31 and the semiconductor chip 32, between the semiconductor chips 32, and between the semiconductor chip 31 and the interconnect substrate 11, and also covering of the outer peripheral surface 12a and upper surface 12b of the chip stack 12 by the underfilling resin 61.

The underfilling resin 61 has not been cured at this stage.

By curing the above-noted underfilling resin 61, the first seal 14, having an elastic modulus (Young's modulus) smaller than that of the second seal 15 and that seals the chip stack 12 is formed.

Specifically, in the case of using a thermally cured resin as the underfilling resin 61, the underfilling resin 61 before curing is heated for curing to a temperature of 150° C. It is possible to use a silicone rubber, for example, as the underfilling resin 61 that is the base material of the first seal 14.

Figure 6:
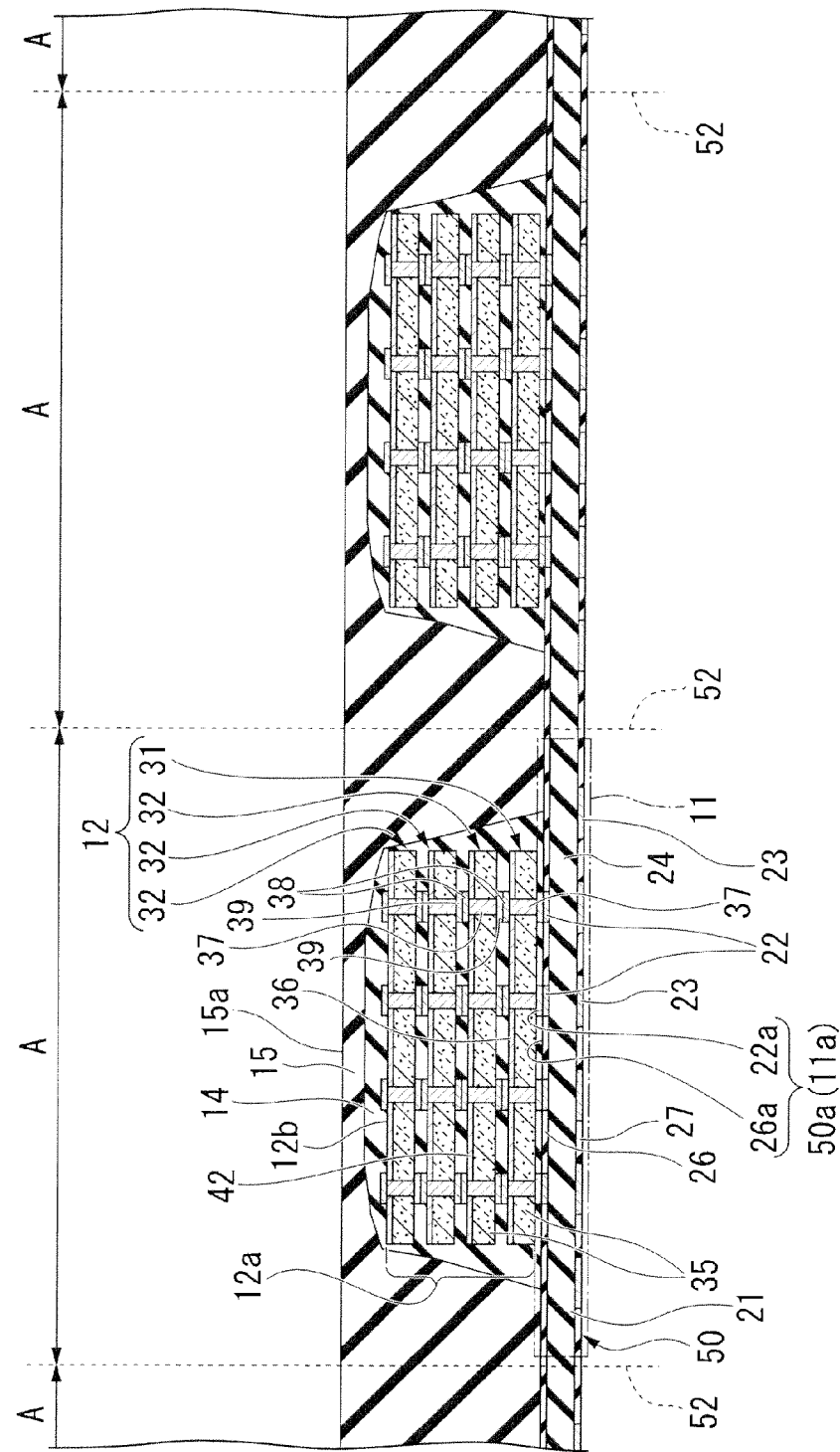
FIG. 6 is a cross sectional elevation view of a step, subsequent to the step of FIG. 5, involved in the method of forming the semiconductor device of FIG. 1 in accordance with the first preferred embodiment of the present invention.

In the process step shown in FIG. 6, a seal is made of the main surface 50a of the interconnect mother board 50 by the first seals 14 and then a second seal 15, having an elastic modulus (Young's modulus) larger than that of the first seal 14 and having a flat upper surface 15a is formed.

The second seal 15 is formed, for example, by the method of transfer molding. In the case of using the transfer molding method, the structure shown in FIG. 5 is disposed inside a cavity (not shown) formed of upper and lower molds (not shown), followed by filling of the cavity by, for example, with a thermally cured resin such as an epoxy resin, and then formation of a second seal 15 by thermally curing the epoxy resin within the cavity by the application of heat. After that, the structure shown in FIG. 6 is removed from the upper and lower molds (not shown).

Although the foregoing description is of the case in which, in FIG. 6, a second seal 15 is formed by the transfer molding method, the second seal 15 may alternatively be formed by a compression molding apparatus, which has little influence of the flow of the molding resin (for example, a compression molding method).

Figure 7:
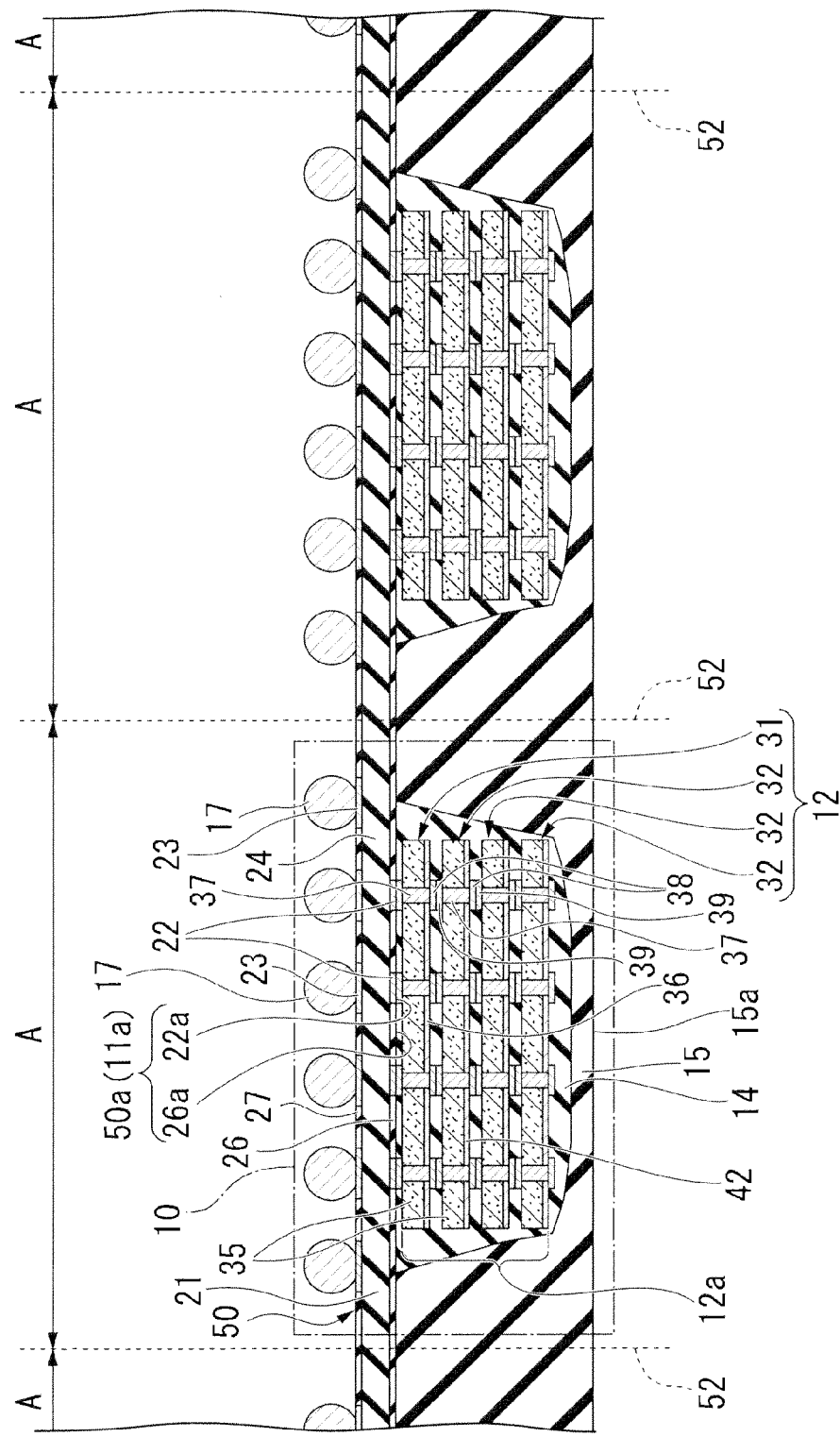
FIG. 7 is a cross sectional elevation view of a step, subsequent to the step of FIG. 6, involved in the method of forming the semiconductor device of FIG. 1 in accordance with the first preferred embodiment of the present invention.

In the process step shown in FIG. 7, the structure shown in FIG. 6 is flipped over top-to-bottom. Then, the external connection terminals 17 are placed on the lands 23 provided on the interconnect mother board 50.

Specifically, the external connection terminals 17 are vacuum held by a plurality of vacuum chucking holes (not shown) provided in a ball-mounting tool (not shown), followed by transfer formation of flux (not shown) onto the vacuum-held external connection terminals 17.

The external connection terminals 17 on which flux (not shown) has been formed are placed all at once onto the plurality of lands 23 disposed in the semiconductor device formation regions A. Next, the external connection terminals 17 are mounted to all of the lands 23 provided on the interconnect mother board 50, after which the external connection terminals 17 are held to the lands 23 by heating the interconnect mother board 50.

By doing this, a semiconductor device 10 is formed on each of the plurality of semiconductor device formation regions A of the interconnect mother board 50. At this stage, the plurality of semiconductor devices 10 are linked to adjacent semiconductor devices 10 and are not separated pieces.

Figure 8:
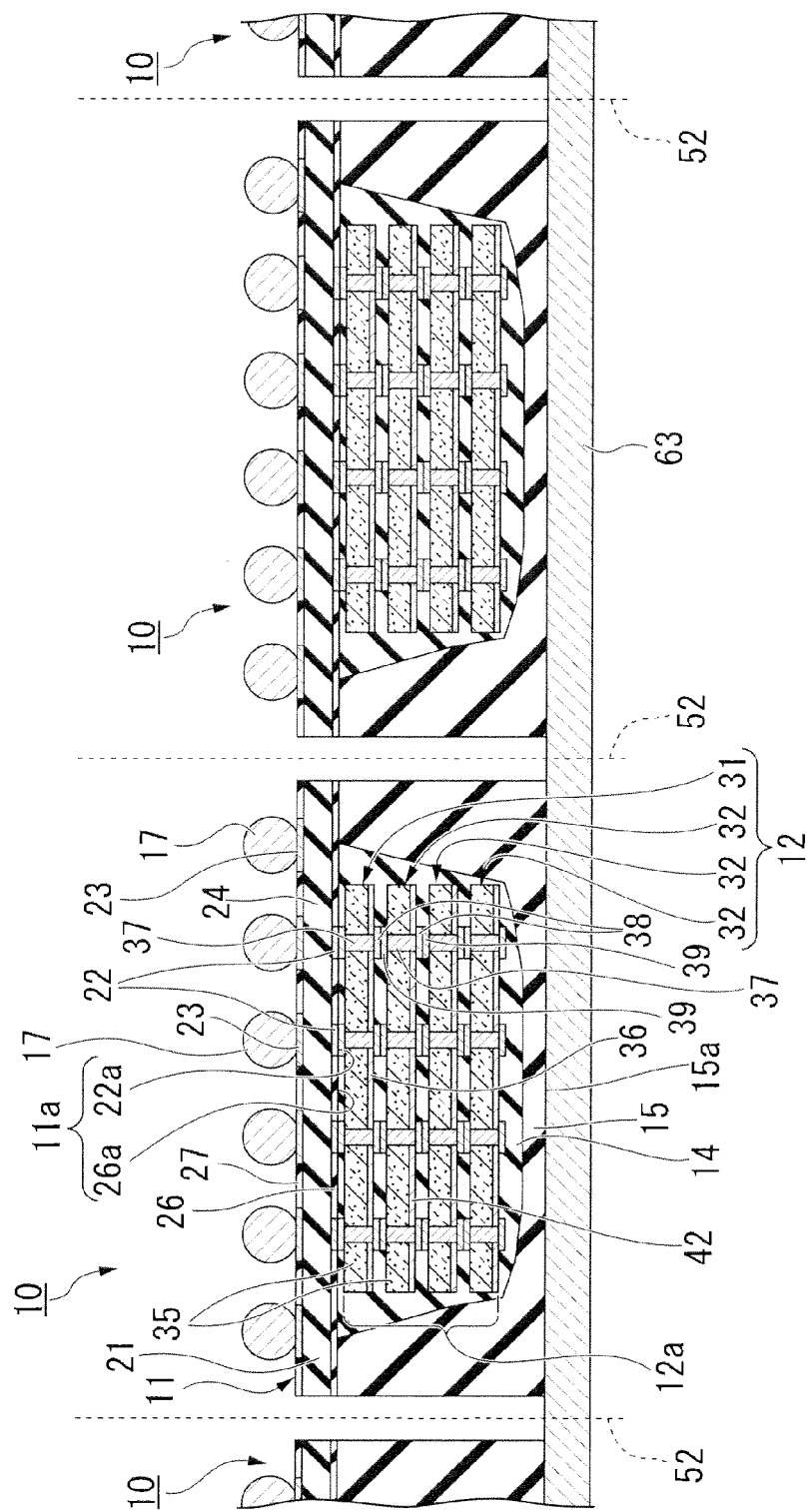
FIG. 8 is a cross sectional elevation view of a step, subsequent to the step of FIG. 7, involved in the method of forming the semiconductor device of FIG. 1 in accordance with the first preferred embodiment of the present invention.

In the process step shown in FIG. 8, a dicing tape 63 is adhered to the upper surface 15a of the second seal 15 provided on the structure shown in FIG. 7 (specifically, the interconnect mother board 50 on which the chip stacks12, the first seal 14, and the second seal 15 are formed). By doing this, the structure shown in FIG. 7 is supported by the dicing tape 63.

By a dicing blade (not shown) provided in a dicing machine that is not shown, the interconnect mother board 50 and the second seal 15 are cut apart along the dicing lines 52, so as to obtain a plurality of separated semiconductor devices 10.

Figure 9:
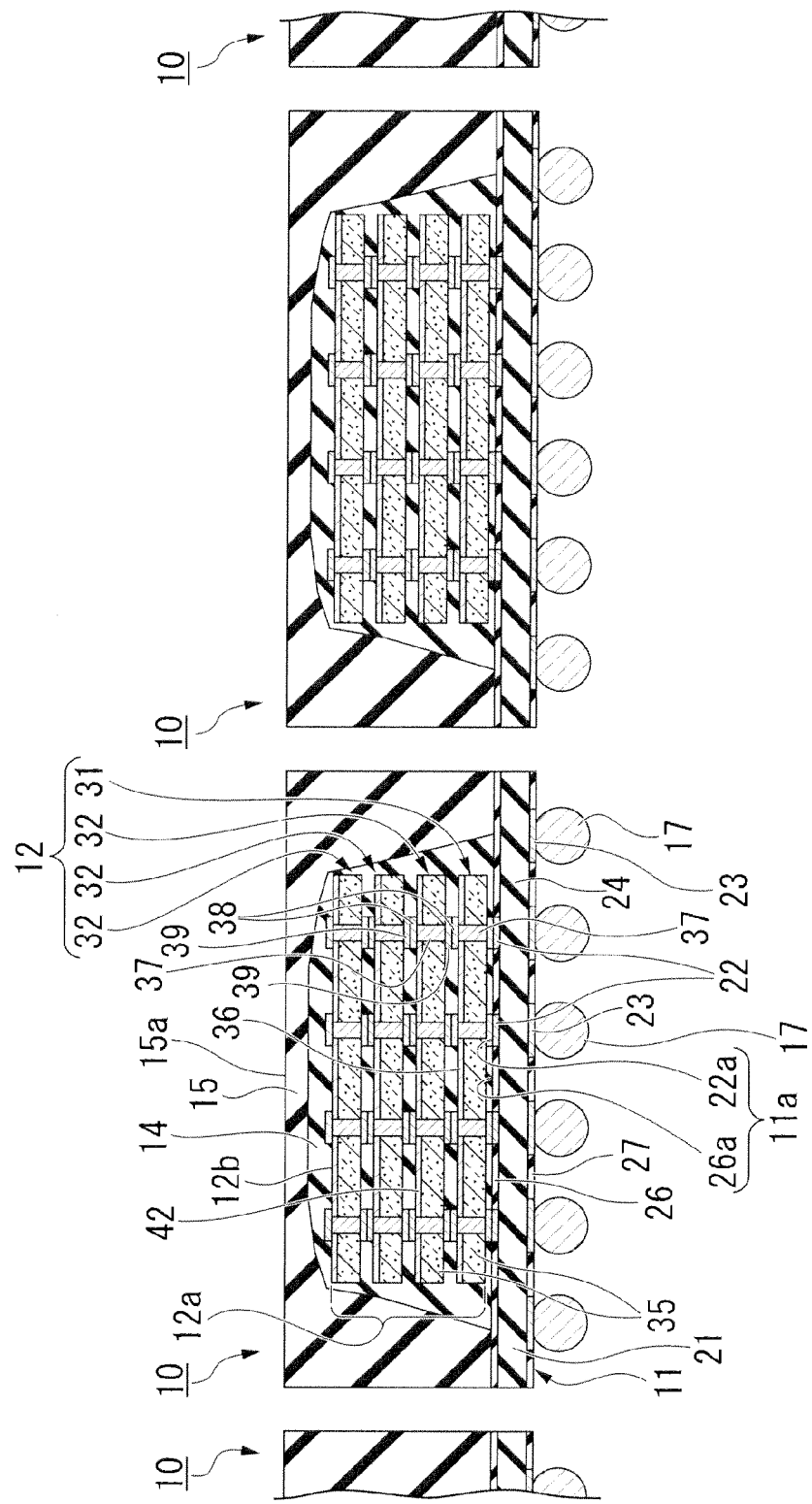
FIG. 9 is a cross sectional elevation view of a step, subsequent to the step of FIG. 8, involved in the method of forming the semiconductor device of FIG. 1 in accordance with the first preferred embodiment of the present invention.

In the process step shown in FIG. 9, the plurality of semiconductor devices 10 adhered to the dicing tape 63 shown in FIG. 8 are picked up. After that, the picked up plurality of semiconductor devices 10 are flipped over top-to-bottom so as to manufacture the semiconductor devices 10 shown in FIG. 9.

According to the method of manufacturing a semiconductor device of the present embodiment, by stacking a plurality of semiconductor chips 31 and 32 having through electrodes 37 onto the main surface 50a of the interconnect mother board 50 (main surface 11a of the interconnect substrate 11), the chip stack 12, which is constituted by the plurality of semiconductor chips 31 and 32 electrically connected to the interconnect mother board 50 (the interconnect substrate 11), is formed. After that, the first seal 14 made of a material having an elastic modulus smaller than that of the second seal 15 is used to fill between the semiconductor chip 31 and the semiconductor chip 32, between the semiconductor chips 32, and between the chip stack 12 and the main surface 50a of the interconnect mother board 50, and also to cover the upper surface 12b and the outer peripheral surface 12a of the chip stack 12, after which the second seal 15 that covers the first seal 14 is formed on the main surface 50a of the interconnect mother board 50, so as to hinder the transmission of internal stress generated within the semiconductor devices 10 to the plurality of semiconductor chips 31 and 32.

By doing this, in addition to being able to suppress damage to the plurality of semiconductor chips 31 and 32, it is possible to hinder the transmission of internal stress to the connection parts between the semiconductor chips 31 and 32, the connection parts between the semiconductor chips 32, and the connection parts between the semiconductor chip 31 and the interconnect substrate 11.

It is therefore possible to improve the electrical connection reliability between the plurality of semiconductor chips 31 and 32, and between the chip stack and the interconnect substrate 11. That is, it is possible to improve the yield of the semiconductor device 10 of the present embodiment.

Although the foregoing is a detailed description of a preferred embodiment of the present invention, the present invention is not restricted to a specific embodiment thereof, and can be subject to various modifications, within the scope of the essence of the present invention as recited in the claims.

Figure 10:
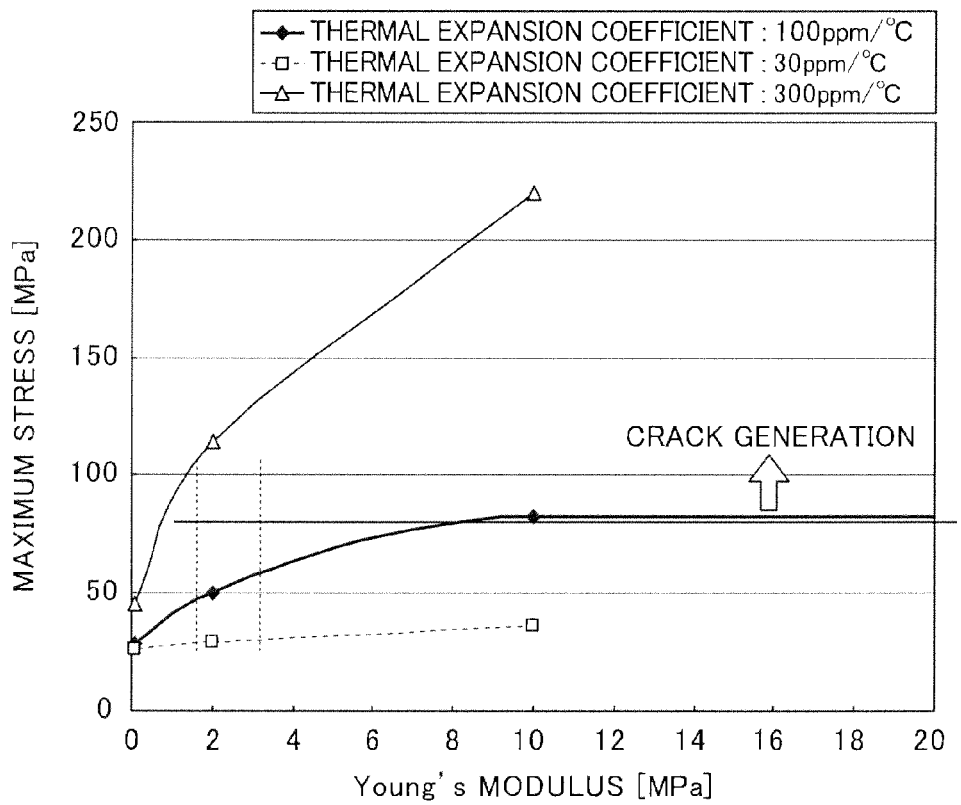
FIG. 10 is a graph of maximum stress versus Young's modulus for different thermal expansion coefficients of a first seal to be included in the semiconductor device of FIG. 1.
Figure 11:
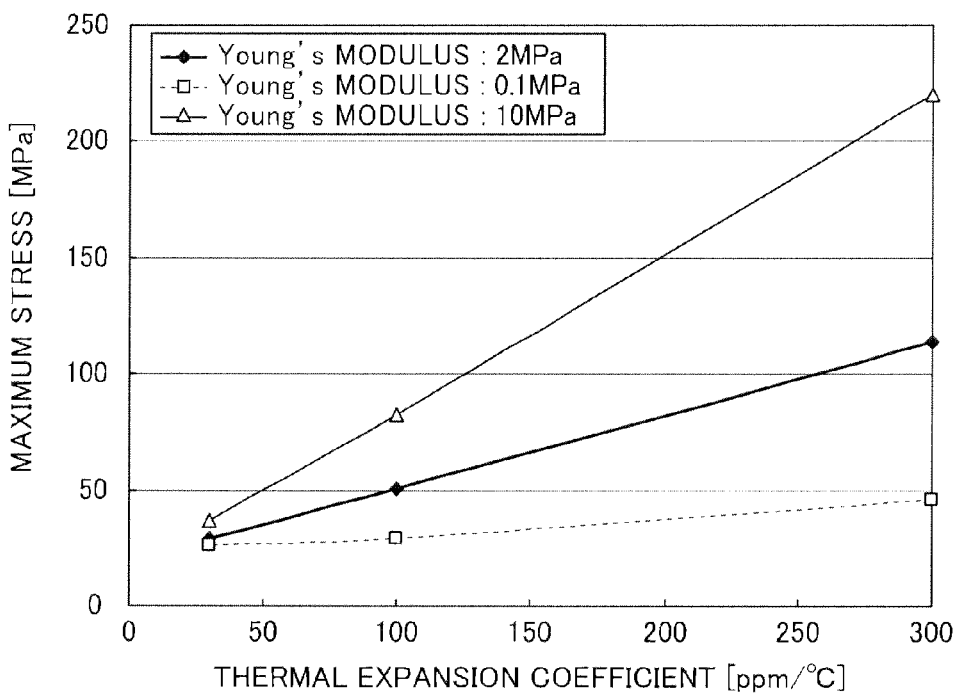
FIG. 11 is a graph of maximum stress versus thermal expansion coefficient for different Young's modulus of a first seal to be included in the semiconductor device of FIG. 1.

FIG. 10 and FIG. 11 are drawings showing the results of a simulation of the relationship between the Young's modulus (elastic modulus) and coefficient of thermal expansion (CTE) of the first seal and the maximum stress. In the plot of FIG. 10, the horizontal axis represents the Young's modulus, and the vertical axis represents the maximum stress. In the plot of FIG. 11, the horizontal axis represents the coefficient of thermal expansion, and the vertical axis represents the maximum stress.

In FIG. 10, the simulation was performed for the cases in which the coefficients of thermal expansion were 30 ppm/° C., 100 ppp/° C., 300 ppm/° C. In FIG. 11, the simulation was performed for the cases in which the Young's moduli of the first seal 14 were 0.1 MPa, 2 MPa, and 10 MPa.

In FIG. 10 and FIG. 11, the simulations were performed for the case of a chip stack 12 in which eight semiconductor chips 32 were stacked over one semiconductor chip 31, the chip stack 12 being disposed over an interconnect substrate 11.

Referring to FIG. 10 and FIG. 11, the results of the simulation of the relationship between the Young's modulus (elastic modulus) and the coefficient of thermal expansion (CTE) of the first seal 14 and the maximum stress will be described.

Referring to FIG. 10 and FIG. 11, as the Young's modulus (elastic modulus) and coefficient of thermal expansion of the first seal 14 increase, the maximum stress acting on the plurality of semiconductor chips 31 and 32 constituting the chip stack 12 becomes larger.

Also, when the maximum stress acting on the semiconductor chips 31 and 32 exceeds 50 MPa, cracking occurs in the semiconductor chips 31 and 32 themselves, the connection parts between the semiconductor chip 31 and the semiconductor chip 32, the connection parts between the semiconductor chips 32, and the connection parts between the semiconductor chip 31 and the interconnect substrate 11, and the electrical connection reliability of the chip stack 12 and between the chip stack 12 and the interconnect substrate 11 is reduced.

Figure 12:
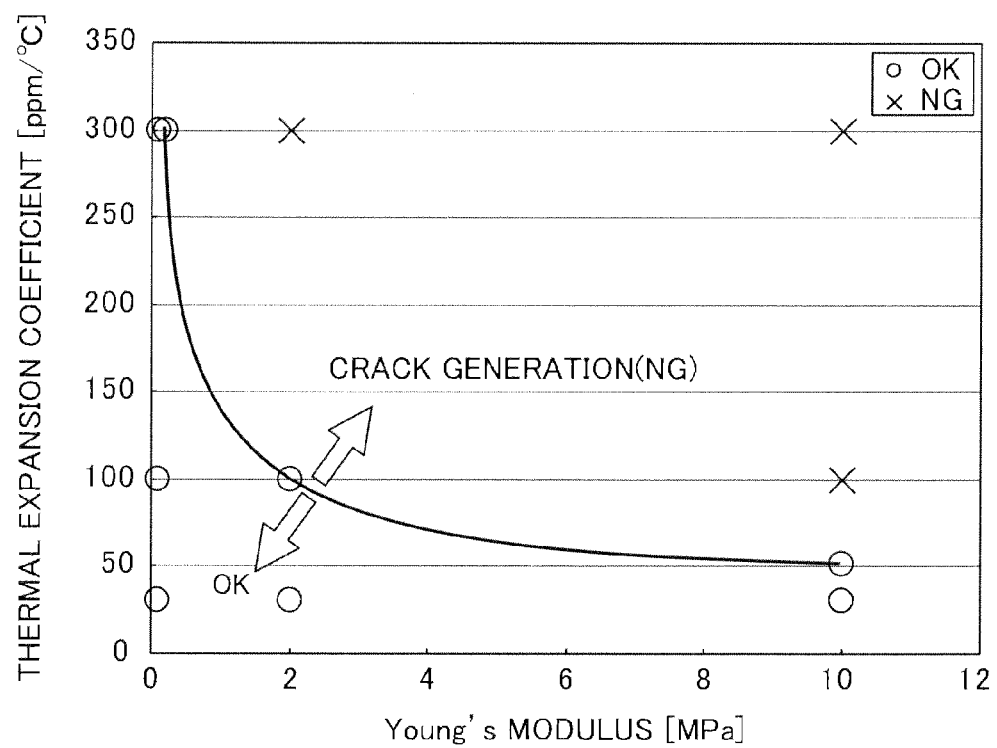
FIG. 12 is a graph of maximum stress versus Young's modulus of a first seal to be included in the semiconductor device of FIG. 1.

FIG. 12 is a drawing showing the relationship between the Young's modulus and coefficient of thermal expansion of the first seal, for the case in which cracking occurs at a stress of 50 MPa.

Referring to FIG. 12, in order to prevent the occurrence of cracking in the semiconductor chips 31 and 32 themselves, the connection parts between the semiconductor chip 31 and the semiconductor chip 32, the connection parts between the semiconductor chips 32, and the connection parts between the semiconductor chip 31 and the interconnect substrate 11, if the Young's modulus of the first seal 14 is 0.2 MPa, it is necessary that the coefficient of thermal expansion of the first seal 14 be 1 to 300 ppm/° C.

Also, in the case in which the Young's modulus of the first seal 14 is 2 MPa, it is necessary that the coefficient of thermal expansion of the first seal 14 be 1 to 100 ppm/° C., and if the Young's modulus of the first seal 14 is 10 MPa, it is necessary that the coefficient of thermal expansion of the first seal 14 be 1 to 50 ppm/° C.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a wiring board;
a stack of semiconductor chips disposed over the wiring board, each of the semiconductor chips including via electrodes, the semiconductor chips being electrically coupled through the via electrodes to each other, the semiconductor chips being electrically coupled through the via electrodes to the wiring board;
a first seal that seals the stack of semiconductor chips and covers a top surface of a topmost semiconductor chip in the stack of semiconductor chips, the stack of semiconductor chips being without a semiconductor chip stacked on top of the topmost semiconductor chip; and
a second seal that covers the first seal,
wherein the first seal is smaller in elastic modulus than the second seal, and
wherein the first seal covers an entire top portion and outer sides of the stack of semiconductor chips.

2. The semiconductor device according to claim 1, wherein the first seal fills gaps between the semiconductor chips and a gap between the wiring board and the stack of semiconductor chips.

3. The semiconductor device according to claim 1, wherein the first seal covers a first surface of the stack of semiconductor chips, the first surface being opposite to a second surface of the stack of semiconductor chips, the second surface facing toward the wring board.

4. The semiconductor device according to claim 1, wherein each of the semiconductor chips further comprises bump electrodes, the semiconductor chips being electrically coupled through the via electrodes and the bump electrodes to each other, the semiconductor chips being electrically coupled through the via electrodes and the bump electrodes to the wiring board.

5. The semiconductor device according to claim 1, further comprising:
external connection electrodes disposed on a first surface of the wiring board, the wiring board having a second surface opposite to the first surface, wherein the stack of semiconductor chips is disposed over the second surface of the wiring board.

6. The semiconductor device according to claim 1, wherein each of the semiconductor chips comprises a circuit element layer on a surface which faces away from the wiring board.

7. The semiconductor device according to claim 1, wherein the elastic modulus of the first seal and a coefficient of thermal expansion of the first seal have a relationship such that when the elastic modulus is 0.2 MPa, the coefficient of thermal expansion is 1 to 300 ppm/° C., when the elastic modulus is 2 MPa, the coefficient of thermal expansion is 1 to 100 ppm/° C., and when the elastic modulus is 10 MPa, the coefficient of thermal expansion is 1 to 50 ppm/° C.

8. The semiconductor device according to claim 1, wherein the first seal comprises a silicone rubber.

9. The semiconductor device according to claim 8, wherein the second seal comprises a mold resin.

10. A semiconductor device comprising:
a wiring board;
a stack of semiconductor chips disposed over the wiring board, each of the semiconductor chips comprising via electrodes and bump electrodes, the semiconductor chips being electrically coupled through the via electrodes and the bump electrodes to each other, the semiconductor chips being electrically coupled through the via electrodes and the bump electrodes to the wiring board;
a first seal that seals the stack of semiconductor chips and covers a top surface of a topmost semiconductor chip in the stack of semiconductor chips, the stack of semiconductor chips being without a semiconductor chip stacked on top of the topmost semiconductor chip, the first seal filling gaps between the semiconductor chips and a gap between the wiring board and the stack of semiconductor chips; and
a second seal that covers the first seal,
wherein the first seal is smaller in Young's modulus than the second seal, and
wherein the first seal covers an entire top portion and outer sides of the stack of semiconductor chips.

11. The semiconductor device according to claim 10, wherein the first seal covers a first surface of the stack of semiconductor chips, the first surface being opposite to a second surface of the stack of semiconductor chips, the second surface facing toward the wring board.

12. The semiconductor device according to claim 10, further comprising:
external connection electrodes disposed on a first surface of the wiring board, the wiring board having a second surface opposite to the first surface,
wherein the stack of semiconductor chips is disposed over the second surface of the wiring board.

13. The semiconductor device according to claim 10, wherein the elastic modulus of the first seal and a coefficient of thermal expansion of the first seal have a relationship such that when the elastic modulus is 0.2 MPa, the coefficient of thermal expansion is 1 to 300 ppm/° C., when the elastic modulus is 2 MPa, the coefficient of thermal expansion is 1 to 100 ppm/° C., and when the elastic modulus is 10 MPa, the coefficient of thermal expansion is 1 to 50 ppm/° C.

14. The semiconductor device according to claim 10, wherein the first seal comprises a silicone rubber.

15. The semiconductor device according to claim 14, wherein the second seal comprises a mold resin.

16. A semiconductor device comprising: an interposer substrate;
a stack of semiconductor chips disposed over the interposer substrate, each of the semiconductor chips including via electrodes, the semiconductor chips being electrically coupled through the via electrodes to each other, the semiconductor chips being electrically coupled through the via electrode to the interposer substrate;
an underfilling resin that seals the stack of semiconductor chips and covers a top surface of a topmost semiconductor chip in the stack of semiconductor chips, the stack of semiconductor chips being without a semiconductor chip stacked on top of the topmost semiconductor chip, the underfilling resin filling gaps between the semiconductor chips and a gap between the interposer substrate and the stack of semiconductor chips; and
a mold resin that covers the underfilling resin,
wherein the underfilling resin is smaller in Young's modulus than the mold resin, and
wherein the underfilling resin covers an entire top portion and outer sides of the stack of semiconductor chips.

17. The semiconductor device according to claim 16, wherein the underfilling resin covers a first surface of the stack of semiconductor chips, the first surface being opposite to a second surface of the stack of semiconductor chips, the second surface facing toward the interposer substrate.

18. The semiconductor device according to claim 16, wherein each of the semiconductor chips further includes bump electrodes, the semiconductor chips being electrically coupled through the via electrodes and the bump electrodes to each other, the semiconductor chips being electrically coupled through the via electrodes and the bump electrodes to the interposer substrate.

19. The semiconductor device according to claim 16, further comprising:
external connection electrodes disposed on a first surface of the interposer substrate, the interposer substrate having a second surface opposite to the first surface,
wherein the stack of semiconductor chips is disposed over the second surface of the interposer substrate.

20. The semiconductor device according to claim 16, wherein the elastic modulus of the underfilling resin and a coefficient of thermal expansion of the underfilling resin have a relationship such that when the elastic modulus is 0.2 MPa, the coefficient of thermal expansion is 1 to 300 ppm/° C., when the elastic modulus is 2 MPa, the coefficient of thermal expansion is 1 to 100 ppm/° C., and when the elastic modulus is 10 MPa, the coefficient of thermal expansion is 1 to 50 ppm/° C.

21. A semiconductor device comprising:
a substrate;
a first semiconductor chip mounted over the substrate, the first semiconductor chip including a plurality of via electrodes;
a second semiconductor chip stacked over the first semiconductor chip, the second semiconductor chip including an upper surface that faces away from the first semiconductor chip, the second semiconductor chip being electrically coupled to the first semiconductor chip through the plurality of via electrodes;
an elastic member covering the upper surface of the second semiconductor chip, the second semiconductor chip being without a semiconductor chip stacked on top of the upper surface; and
a sealing resin covering the elastic member,
wherein the elastic member is smaller in elastic modulus than the sealing resin, and
wherein the elastic member covers an entire top portion and outer sides of the stacked first and second semiconductor chips.

22. The semiconductor device according to claim 21, wherein the elastic modulus of the elastic member and a coefficient of thermal expansion of the elastic member have a relationship such that when the elastic modulus is 0.2 MPa, the coefficient of thermal expansion is 1 to 300 ppm/° C., when the elastic modulus is 2 MPa, the coefficient of thermal expansion is 1 to 100 ppm/° C., and when the elastic modulus is 10 MPa, the coefficient of thermal expansion is 1 to 50 ppm/° C.

23. The semiconductor device according to claim 21, wherein the elastic member covers the first semiconductor chip and the second semiconductor chip.

24. The semiconductor device according to claim 23, wherein the elastic member fills a gap between the first semiconductor chip and the second semiconductor chip, and a gap between the substrate and the first semiconductor chip.

25. The semiconductor device according to claim 21, wherein the first semiconductor chip includes a plurality of via electrodes, the second semiconductor chip being electrically coupled to the first semiconductor chip through the plurality of via electrodes.

26. The semiconductor device according to claim 25, further comprising:
    a plurality of external electrodes disposed on the substrate, the first semiconductor chip being electrically coupled to the plurality of external terminals through the plurality of via electrodes.

\* \* \* \* \*